United States Patent
Charbonneau et al.

(10) Patent No.: US 11,805,595 B2
(45) Date of Patent: Oct. 31, 2023

(54) BACKPLANE FOOTPRINT FOR HIGH SPEED, HIGH DENSITY ELECTRICAL CONNECTORS

(71) Applicant: Amphenol Corporation, Wallingford, CT (US)

(72) Inventors: Marc Robert Charbonneau, Bedford, NH (US); Jose Ricardo Paniagua, Newmarket, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 17/872,082

(22) Filed: Jul. 25, 2022

(65) Prior Publication Data

US 2022/0361320 A1    Nov. 10, 2022

Related U.S. Application Data

(60) Continuation of application No. 17/218,335, filed on Mar. 31, 2021, now Pat. No. 11,553,589, which is a
(Continued)

(51) Int. Cl.
*H05K 1/02* (2006.01)
*H05K 1/03* (2006.01)
(Continued)

(52) U.S. Cl.
CPC ....... *H05K 1/0245* (2013.01); *H01R 12/7082* (2013.01); *H01R 12/716* (2013.01);
(Continued)

(58) Field of Classification Search
USPC ............... 174/262, 251, 254, 261, 266, 377; 361/752, 777, 780; 439/65, 660; 29/832,
(Continued)

(56) References Cited

U.S. PATENT DOCUMENTS 4,632,476 A    12/1986  Schell
4,806,107 A    2/1989   Arnold et al.
(Continued)

FOREIGN PATENT DOCUMENTS

CN    1329812 A    1/2002
CN    1918952 A    2/2007
(Continued)

OTHER PUBLICATIONS

Chinese Office Action in connection with Chinese Application No. 20181120767LX, dated Sep. 3, 2020.
(Continued)

*Primary Examiner* — Xiaoliang Chen
(74) *Attorney, Agent, or Firm* — Wolf, Greenfield & Sacks, P.C.

(57) ABSTRACT

A printed circuit board includes a plurality of layers including attachment layers and routing layers; and columns of via patterns formed in the plurality of layers, wherein via patterns in adjacent columns are offset in a direction of the columns, each of the via patterns comprising: first and second signal vias forming a differential signal pair, the first and second signal vias extending through at least the attachment layers; and at least one conductive shadow via located between the first and second signal vias of the differential pair. In some embodiments, at least one conductive shadow via is electrically connected to a conductive surface film.

5 Claims, 9 Drawing Sheets

Related U.S. Application Data division of application No. 16/666,536, filed on Oct. 29, 2019, now Pat. No. 10,993,314, which is a division of application No. 16/214,298, filed on Dec. 10, 2018, now Pat. No. 10,485,097, which is a division of application No. 15/452,096, filed on Mar. 7, 2017, now Pat. No. 10,187,972.

(60) Provisional application No. 62/305,049, filed on Mar. 8, 2016.

(51) Int. Cl.

| | | |
|---|---|---|
| *H05K 1/09* | (2006.01) | |
| *H05K 1/11* | (2006.01) | |
| *H05K 1/18* | (2006.01) | |
| *H05K 3/04* | (2006.01) | |
| *H05K 3/30* | (2006.01) | |
| *H05K 3/32* | (2006.01) | |
| *H05K 3/40* | (2006.01) | |
| *H05K 3/42* | (2006.01) | |
| *H05K 3/46* | (2006.01) | |
| *H01R 12/51* | (2011.01) | |
| *H01R 12/70* | (2011.01) | |
| *H01R 12/73* | (2011.01) | |
| *H01R 12/71* | (2011.01) | |

(52) U.S. Cl.
CPC ......... *H05K 1/0219* (2013.01); *H05K 1/0251* (2013.01); *H05K 1/115* (2013.01); *H05K 3/429* (2013.01); *H05K 1/0225* (2013.01); *H05K 2201/096* (2013.01); *H05K 2201/09727* (2013.01); *H05K 2201/09845* (2013.01)

(58) Field of Classification Search
USPC .................................................. 29/846, 852
See application file for complete search history.

(56) References Cited

U.S. PATENT DOCUMENTS

| | | | |
|---|---|---|---|
| 4,846,727 | A | 7/1989 | Glover et al. |
| 4,975,084 | A | 12/1990 | Fedder et al. |
| 5,038,252 | A | 8/1991 | Johnson |
| 5,066,236 | A | 11/1991 | Broeksteeg |
| 5,120,258 | A | 6/1992 | Carlton |
| 5,429,520 | A | 7/1995 | Morlion et al. |
| 5,429,521 | A | 7/1995 | Morlion et al. |
| 5,433,617 | A | 7/1995 | Morlion et al. |
| 5,433,618 | A | 7/1995 | Morlion et al. |
| 5,484,310 | A | 1/1996 | McNamara et al. |
| 5,496,183 | A | 3/1996 | Soes et al. |
| 5,828,555 | A | 10/1998 | Itoh |
| 6,137,064 | A | 10/2000 | Kiani et al. |
| 6,162,997 | A | 12/2000 | Memis |
| 6,166,615 | A | 12/2000 | Winslow et al. |
| 6,181,219 | B1 | 1/2001 | Gailus et al. |
| 6,183,301 | B1 | 2/2001 | Paagman |
| 6,293,827 | B1 | 9/2001 | Stokoe |
| 6,299,438 | B1 | 10/2001 | Sahagian et al. |
| 6,384,341 | B1 | 5/2002 | Rothermel et al. |
| 6,388,208 | B1 | 5/2002 | Kiani et al. |
| 6,394,822 | B1 | 5/2002 | McNamara |
| 6,503,103 | B1 | 1/2003 | Cohen et al. |
| 6,607,402 | B2 | 8/2003 | Cohen et al. |
| 6,663,442 | B1 | 12/2003 | Helster et al. |
| 6,696,732 | B2 | 2/2004 | Matsuoka et al. |
| 6,776,659 | B1 | 8/2004 | Stokoe et al. |
| 6,843,657 | B2 | 1/2005 | Driscoll et al. |
| 6,910,897 | B2 | 6/2005 | Driscoll et al. |
| 7,139,177 | B2 | 11/2006 | Gottlieb |
| 7,163,421 | B1 | 1/2007 | Cohen et al. |
| 7,239,526 | B1 | 7/2007 | Bibee |
| 7,317,166 | B2 | 1/2008 | Nakamura |
| 7,448,909 | B2 | 11/2008 | Regnier et al. |
| 7,633,766 | B2 | 12/2009 | Regnier et al. |
| 7,645,944 | B2 | 1/2010 | Casher et al. |
| 7,705,246 | B1 | 4/2010 | Pritchard et al. |
| 7,731,537 | B2 | 6/2010 | Amleshi et al. |
| 7,794,278 | B2 | 9/2010 | Cohen et al. |
| 7,819,697 | B2 | 10/2010 | Glover et al. |
| 7,897,880 | B1 | 3/2011 | Goergen et al. |
| 7,985,097 | B2 | 7/2011 | Gulla |
| 7,999,192 | B2 | 8/2011 | Chan et al. |
| 8,080,738 | B2 | 12/2011 | Morgan |
| 8,241,067 | B2 | 8/2012 | Girard, Jr. et al. |
| 8,251,745 | B2 | 8/2012 | Johnescu |
| 8,273,994 | B2 | 9/2012 | Reynov et al. |
| 8,715,006 | B2 | 5/2014 | Jeon |
| 8,841,560 | B1 | 9/2014 | Roberts |
| 8,889,999 | B2 | 11/2014 | Thurairajaratnam et al. |
| 9,202,783 | B1 | 12/2015 | Simpson et al. |
| 9,544,992 | B2 | 1/2017 | Minich |
| 9,548,551 | B1 | 1/2017 | Becker et al. |
| 9,560,741 | B2 | 1/2017 | Rose et al. |
| 9,585,259 | B1 | 2/2017 | Reynov |
| 9,640,913 | B1 | 5/2017 | Wang |
| 9,775,231 | B2 | 9/2017 | Cartier, Jr. |
| 9,807,869 | B2 | 10/2017 | Gailus et al. |
| 9,923,293 | B2 | 3/2018 | Swernofsky et al. |
| 9,930,772 | B2 | 3/2018 | Morgan et al. |
| 10,034,366 | B2 | 7/2018 | Gailus et al. |
| 10,187,972 | B2 | 1/2019 | Charbonneau et al. |
| 10,201,074 | B2 | 2/2019 | Charbonneau et al. |
| 10,375,822 | B2 | 8/2019 | Li et al. |
| 10,455,689 | B2 | 10/2019 | Gailus et al. |
| 10,485,097 | B2 | 11/2019 | Charbonneau et al. |
| 10,638,599 | B2 | 4/2020 | Charbonneau et al. |
| 10,849,218 | B2 | 11/2020 | Gailus et al. |
| 10,993,314 | B2 | 4/2021 | Charbonneau et al. |
| 11,057,995 | B2 | 7/2021 | Cartier, Jr. et al. |
| 11,096,270 | B2 | 8/2021 | Charbonneau et al. |
| 2002/0179332 | A1 | 12/2002 | Uematsu et al. |
| 2003/0188889 | A1 | 10/2003 | Straub et al. |
| 2004/0115968 | A1 | 6/2004 | Cohen |
| 2004/0150970 | A1 | 8/2004 | Lee |
| 2004/0183212 | A1 | 9/2004 | Alcoe |
| 2004/0263181 | A1 | 12/2004 | Ye et al. |
| 2005/0161254 | A1 | 7/2005 | Clink |
| 2005/0201065 | A1 | 9/2005 | Regnier et al. |
| 2005/0202722 | A1 | 9/2005 | Regnier et al. |
| 2005/0245105 | A1 | 11/2005 | Driscoll et al. |
| 2005/0247482 | A1 | 11/2005 | Nakamura |
| 2006/0022303 | A1 | 2/2006 | Desai et al. |
| 2006/0043572 | A1 | 3/2006 | Sugimoto et al. |
| 2006/0090933 | A1 | 5/2006 | Wig et al. |
| 2006/0091545 | A1 | 5/2006 | Casher et al. |
| 2006/0185890 | A1 | 8/2006 | Robinson |
| 2006/0228912 | A1 | 10/2006 | Morlion et al. |
| 2006/0232301 | A1 | 10/2006 | Morlion et al. |
| 2006/0244124 | A1 | 11/2006 | Ohlsson |
| 2007/0130555 | A1 | 6/2007 | Osaka |
| 2007/0205847 | A1 | 9/2007 | Kushta et al. |
| 2008/0093726 | A1 | 4/2008 | Preda et al. |
| 2008/0237893 | A1 | 10/2008 | Quach et al. |
| 2008/0283285 | A1 | 11/2008 | Freeh et al. |
| 2008/0308313 | A1 | 12/2008 | Gorcea |
| 2008/0318450 | A1 | 12/2008 | Regnier et al. |
| 2009/0056999 | A1 | 3/2009 | Kashiwakura |
| 2009/0188711 | A1 | 7/2009 | Ahmad |
| 2010/0048043 | A1 | 2/2010 | Morlion et al. |
| 2010/0101083 | A1 | 4/2010 | Lee et al. |
| 2010/0307798 | A1 | 12/2010 | Izadian |
| 2011/0062593 | A1 | 3/2011 | Abe et al. |
| 2011/0081809 | A1 | 4/2011 | Morgan |
| 2011/0203843 | A1 | 8/2011 | Kushta |
| 2011/0232955 | A1 | 9/2011 | Morgan |
| 2012/0003848 | A1 | 1/2012 | Casher et al. |
| 2012/0167386 | A1 | 7/2012 | Goergen et al. |
| 2012/0199380 | A1 | 8/2012 | Olsen |
| 2012/0243147 | A1 | 9/2012 | Marconi et al. |
| 2012/0243184 | A1 | 9/2012 | Lee |

(56) References Cited

U.S. PATENT DOCUMENTS

| | | |
|---|---|---|
| 2012/0252232 A1 | 10/2012 | Buck et al. |
| 2013/0005160 A1 | 1/2013 | Minich |
| 2013/0056255 A1 | 3/2013 | Biddle et al. |
| 2013/0077268 A1* | 3/2013 | Brunker ............... H05K 1/115 361/752 |
| 2013/0098671 A1 | 4/2013 | Thurairajaratnam et al. |
| 2013/0109232 A1 | 5/2013 | Paniaqua |
| 2013/0112465 A1 | 5/2013 | Duvanenko |
| 2013/0175077 A1 | 7/2013 | Kim et al. |
| 2013/0199834 A1* | 8/2013 | De Geest ............ H05K 1/0251 174/266 |
| 2013/0215587 A1 | 8/2013 | Kawai |
| 2013/0330941 A1* | 12/2013 | Jeon .................. H01R 13/6594 174/266 |
| 2014/0004724 A1 | 1/2014 | Cartier, Jr. et al. |
| 2014/0140027 A1 | 5/2014 | Enriquez Shibayama et al. |
| 2014/0182891 A1 | 7/2014 | An et al. |
| 2014/0197545 A1 | 7/2014 | Chase et al. |
| 2014/0209370 A1 | 7/2014 | Minich |
| 2014/0209371 A1 | 7/2014 | Minich et al. |
| 2015/0015288 A1 | 1/2015 | Ma |
| 2015/0114706 A1 | 4/2015 | Rose et al. |
| 2015/0264801 A1 | 9/2015 | Martin et al. |
| 2016/0150633 A1 | 5/2016 | Cartier, Jr. |
| 2016/0150639 A1 | 5/2016 | Gailus et al. |
| 2016/0150645 A1 | 5/2016 | Gailus et al. |
| 2016/0183373 A1* | 6/2016 | Williams ............ H05K 1/0231 174/251 |
| 2016/0309576 A1 | 10/2016 | Sharav et al. |
| 2017/0047686 A1 | 2/2017 | Wig |
| 2017/0196079 A1 | 7/2017 | Morgan et al. |
| 2017/0265296 A1 | 9/2017 | Charbonneau et al. |
| 2018/0145457 A1 | 5/2018 | Kondo et al. |
| 2018/0324941 A1 | 11/2018 | Gailus et al. |
| 2019/0037684 A1 | 1/2019 | Park et al. |
| 2019/0110359 A1 | 4/2019 | Charbonneau et al. |
| 2019/0150273 A1 | 5/2019 | Charbonneau et al. |
| 2019/0380204 A1 | 12/2019 | Cartier et al. |
| 2020/0022252 A1 | 1/2020 | Gailus et al. |
| 2020/0068705 A1 | 2/2020 | Charbonneau et al. |
| 2020/0229299 A1 | 7/2020 | Charbonneau et al. |
| 2020/0373689 A1 | 11/2020 | Cartier et al. |
| 2021/0076486 A1 | 3/2021 | Gailus et al. |
| 2021/0219420 A1 | 7/2021 | Charbonneau et al. |
| 2021/0257788 A1 | 8/2021 | Cartier, Jr. et al. |
| 2021/0315102 A1 | 10/2021 | Cartier, Jr. et al. |
| 2021/0329775 A1 | 10/2021 | Charbonneau et al. |

FOREIGN PATENT DOCUMENTS

| | | |
|---|---|---|
| CN | 101142860 A | 3/2008 |
| CN | 101378633 A | 3/2009 |
| CN | 101849324 A | 9/2010 |
| CN | 101925253 A | 12/2010 |
| CN | 201709040 U | 1/2011 |
| CN | 102265708 A | 11/2011 |
| CN | 202840016 U | 3/2013 |
| CN | 104040787 A | 9/2014 |
| EP | 3200572 A1 | 8/2017 |
| JP | 2000-183242 A | 6/2000 |
| JP | 2002-531960 A | 9/2002 |
| JP | 2007-142307 A | 6/2007 |
| JP | 2009-059873 A | 3/2009 |
| JP | 2014-107494 A | 6/2014 |
| WO | WO 00/33624 A1 | 6/2000 |
| WO | WO 2009/023238 A1 | 2/2009 |
| WO | WO 2010/111379 A2 | 9/2010 |
| WO | WO 2014/105435 A1 | 7/2014 |

OTHER PUBLICATIONS

Chinese Office Action in connection with Chinese Application No. 201580073832.9, dated May 15, 2020.

Extended European Search Report dated Jun. 29, 2021 in connection with European Application No. 18875264.6.

Extended European Search Report for European Application No. 14745727.9 dated Oct. 21, 2016.

International Preliminary Report on Patentability dated Dec. 24, 2020 for Application No. PCT/US2019/036285.

International Preliminary Report on Patentability dated Jun. 1, 2017 for Application No. PCT/US2015/061907.

International Preliminary Report on Patentability dated Jun. 1, 2017 for Application No. PCT/US2015/061919.

International Preliminary Report on Patentability dated Jun. 1, 2017 for Application No. PCT/US2015/061930.

International Preliminary Report on Patentability dated May 22, 2020 for Application No. PCT/US2018/059757.

International Preliminary Report on Patentability dated Sep. 20, 2018 for Application No. PCT/US2017/021158.

International Search Report and Written Opinion for International Application No. PCT/US2018/059757 dated Mar. 7, 2019.

International Search Report and Written Opinion for International Application No. PCT/US2019/036285 dated Sep. 27, 2019.

International Search Report and Written Opinion for International Application No. PCT/US2021/015234, dated May 17, 2021.

International Search Report and Written Opinion dated Apr. 8, 2016 for Application No. PCT/US2015/061919.

International Search Report and Written Opinion dated Apr. 8, 2016 for Application No. PCT/US2015/061930.

International Search Report and Written Opinion dated Mar. 8, 2016 for Application No. PCT/US2015/061907.

International Search Report and Written Opinion dated May 31, 2017 for Application No. PCT/US2017/021158.

International Preliminary Report on Patentability dated Aug. 11, 2022 for Application No. PCT/US2021/015234.

No Author Listed], ExaMAX™ Connector System, press-fit products. FCI Application Specification No. GS-20-0361. Preliminary. Revision 6. Mar. 12, 2014. 25 pages.

No Author Listed], SFF-8643 Specification for Mini Multilane 12 Gbs 8/4x Unshielded Connector, Rev 2.3. SFF Committee, Jan. 11, 2011, 24 pages.

No Author Listed], Strada Whisper Connector Daughtercard Footprint. Tyco Electronics, Mar. 24, 2010, 1 page.

No Author Listed], Strada Whisper High Speed Backplane Connector System. Tyco Electronics. Presentation. Mar. 24, 2010. 15 pages.

No Author Listed], Zipline Connector System, http://www.slideshare.net/elementl4/zipline-connector-system Mar. 10, 2011. Last accessed Oct. 12, 2015. 15 pages.

* cited by examiner

BACKPLANE FOOTPRINT FOR HIGH SPEED, HIGH DENSITY ELECTRICAL CONNECTORS

CROSS REFERENCE TO RELATED APPLICATIONS

This application is a continuation of U.S. patent application Ser. No. 17/218,335, filed Mar. 31, 2021, which is a divisional of U.S. patent application Ser. No. 16/666,536, filed Oct. 29, 2019, now U.S. Pat. No. 10,993,314, which is a divisional of U.S. patent application Ser. No. 16/214,298, filed Dec. 10, 2018, now U.S. Pat. No. 10,485,097, which is a divisional of U.S. patent application Ser. No. 15/452,096, filed Mar. 7, 2017, now U.S. Pat. No. 10,187,972, which claims priority based on Provisional Application No. 62/305,049, filed Mar. 8, 2016, each of which is hereby incorporated by reference in its entirety.

BACKGROUND

This patent application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several printed circuit boards is to have one printed circuit board serve as a backplane. Other printed circuit boards, called "daughter boards" or "daughter cards," may be connected through the backplane.

A known backplane has the form of a printed circuit board onto which many connectors may be mounted. Conductive traces in the backplane may be electrically connected to signal conductors in the connectors so that signals may be routed between the connectors. Daughter cards may also have connectors mounted thereon. The connectors mounted on a daughter card may be plugged into the connectors mounted on the backplane. In this way, signals may be routed among the daughter cards through the backplane. The daughter cards may plug into the backplane at a right angle. The connectors used for these applications may therefore include a right angle bend and are often called "right angle connectors." Other known connectors include, but are not limited to, orthogonal midplane connectors and midplaneless direct attachment orthogonal connectors.

Connectors may also be used in other configurations for interconnecting printed circuit boards and for interconnecting other types of devices, such as cables, to printed circuit boards. Sometimes, one or more smaller printed circuit boards may be connected to another larger printed circuit board. In such a configuration, the larger printed circuit board may be called a "mother board" and the printed circuit boards connected to it may be called daughter boards. Also, boards of the same size or similar sizes may sometimes be aligned in parallel. Connectors used in these applications are often called "stacking connectors" or "mezzanine connectors."

Regardless of the exact application, electrical connector designs have been adapted to mirror trends in the electronics industry. Electronic systems generally have gotten smaller, faster, and functionally more complex. Because of these changes, the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

In a high density, high speed connector, electrical conductors may be so close to each other that there may be electrical interference between adjacent signal conductors. To reduce interference, and to otherwise provide desirable electrical properties, shield members are often placed between or around adjacent signal conductors. The shields may prevent signals carried on one conductor from creating "crosstalk" on another conductor. The shield may also impact the impedance of each conductor, which may further affect electrical properties.

Examples of shielding can be found in U.S. Pat. Nos. 4,632,476 and 4,806,107, which show connector designs in which shields are used between columns of signal contacts. These patents describe connectors in which the shields run parallel to the signal contacts through both the daughter board connector and the backplane connector. Cantilevered beams are used to make electrical contact between the shield and the backplane connectors. U.S. Pat. Nos. 5,433,617, 5,429,521, 5,429,520, and 5,433,618 show a similar arrangement, although the electrical connection between the backplane and shield is made with a spring type contact. Shields with torsional beam contacts are used in the connectors described in U.S. Pat. No. 6,299,438. Further shields are shown in U.S. Publication No. 2013/0109232.

Other connectors have the shield plate within only the daughter board connector. Examples of such connector designs can be found in U.S. Pat. Nos. 4,846,727, 4,975,084, 5,496,183, and 5,066,236. Another connector with shields only within the daughter board connector is shown in U.S. Pat. No. 5,484,310. U.S. Pat. No. 7,985,097 is a further example of a shielded connector.

Other techniques may be used to control the performance of a connector. For example, transmitting signals differentially may reduce crosstalk. Differential signals are carried on a pair of conductive paths, called a "differential pair." The voltage difference between the conductive paths represents the signal. In general, a differential pair is designed with preferential coupling between the conductive paths of the pair. For example, the two conductive paths of a differential pair may be arranged to run closer to each other than to adjacent signal paths in the connector. No shielding is desired between the conductive paths of the pair, but shielding may be used between differential pairs. Electrical connectors can be designed for differential signals as well as for single-ended signals. Examples of differential signal electrical connectors are shown in U.S. Pat. Nos. 6,293,827, 6,503,103, 6,776,659, 7,163,421, and 7,794,278.

In an interconnection system, such connectors are attached to printed circuit boards, one of which may serve as a backplanes for routing signals between the electrical connectors and for providing reference planes to which reference conductors in the connectors may be grounded. Typically the backplane is formed as a multi-layer assembly manufactured from stacks of dielectric sheets, sometimes called "prepreg". Some or all of the dielectric sheets may have a conductive film on one or both surfaces. Some of the conductive films may be patterned, using lithographic or laser printing techniques, to form conductive traces that are used to make interconnections between circuit boards, circuits and/or circuit elements. Others of the conductive films may be left substantially intact and may act as ground planes or power planes that supply the reference potentials. The dielectric sheets may be formed into an integral board structure such as by pressing the stacked dielectric sheets together under pressure.

To make electrical connections to the conductive traces or ground/power planes, holes may be drilled through the printed circuit board. These holes, or "vias", are filled or plated with metal such that a via is electrically connected to one or more of the conductive traces or planes through which it passes.

To attach connectors to the printed circuit board, contact pins or contact "tails" from the connectors may be inserted into the vias, with or without using solder. The vias are sized to accept the contact tails of the connector.

As in the case of the connectors that attach to the printed circuit boards, the electrical performance of printed circuit boards is at least partially dependent on the structures of the conductive traces, ground planes and vias formed in the printed circuit boards. Further, electrical performance issues become more acute as the density of signal conductors and the operating frequencies of the connectors increase. Such electrical performance issues may include, but are not limited to, crosstalk between closely-spaced signal conductors.

SUMMARY

In accordance with embodiments, a printed circuit board comprises a plurality of layers including attachment layers and routing layers; and columns of via patterns formed in the plurality of layers, wherein via patterns in adjacent columns are offset in a direction of the columns, each of the via patterns comprising: first and second signal vias forming a differential signal pair, the first and second signal vias extending through at least the attachment layers; and at least one conductive shadow via located between the first and second signal vias of the differential pair. Each of the via patterns may further comprise ground vias extending through at least the attachment layers.

In some embodiments, the at least one shadow via is located on a line that is perpendicular to the direction of the columns.

In some embodiments, the line that is perpendicular to the direction of the columns is located midway between the first and second signal vias.

In some embodiments, the at least one shadow via includes two shadow vias located on the line.

In some embodiments, the at least one shadow via is smaller in diameter than the first and second signal vias.

In some embodiments, the at least one shadow via extends through the plurality of layers.

In some embodiments, the at least one shadow via is plated or filled with a conductive material.

In some embodiments, the printed circuit board further comprises additional shadow vias located between adjacent via patterns in each of the columns.

In some embodiments, each of the via patterns further comprises ground vias extending through at least the attachment layers, the ground vias including ground conductors.

In some embodiments, the first and second signal vias and the ground vias are configured to accept compliant pins of a connector.

In some embodiments, each of the via patterns further comprises an antipad surrounding the first and second signal vias.

In some embodiments, each of the via patterns further comprises a first antipad surrounding the first signal via and a second antipad surrounding the second signal via.

In some embodiments, first and second signal traces are connected to the first and second signal vias, respectively, in a breakout layer of the routing layers and wherein the first and second antipads in a layer below the breakout layer include ground plane projections toward the first and second signal vias underneath the first and second signal traces.

In some embodiments, the at least one shadow via comprises a slot-shaped shadow via.

In accordance with further embodiments, a printed circuit board comprises a plurality of layers including attachment layers and routing layers; and columns of via patterns formed in the plurality of layers, wherein via patterns in adjacent columns are offset in a direction of the columns, each of the via patterns comprising: first and second signal vias forming a differential signal pair, the first and second signal vias extending through the attachment layers to at least one breakout layer of the routing layers; at least one antipad surrounding the first and second signal vias; and first and second conductive shadow vias located between the first and second signal vias of the differential pair on a first line that is perpendicular to a second line through the first and second signal vias and that is midway between the first and second signal vias.

In some embodiments, the first and second shadow vias are smaller in diameter than the first and second signal vias.

In some embodiments, the first and second shadow vias extend through the plurality of layers.

In some embodiments, the first and second shadow vias are plated or filled with a conductive material.

In some embodiments, the printed circuit board further comprises additional shadow vias located between adjacent via patterns in each of the columns.

In some embodiments, each of the via patterns further comprises ground vias extending through at least the attachment layers, the ground vias including ground conductors.

In some embodiments, the first and second signal vias and the ground vias are configured to accept compliant pins of a connector.

In some embodiments, the first and second shadow vias contact opposite sides of the antipad and divide the antipad into first and second sections surrounding the first and second signal vias, respectively.

In some embodiments, each of the first and second shadow vias is equally spaced from the first and second signal vias.

In some embodiments, the first and second signal vias have drill diameters in a range of 14 to 22 mils.

In some embodiments, the first and second shadow vias have drill diameters in a range of 8 to 14 mils.

In some embodiments, the first and second signal vias are 3 to 6 mils larger in diameter than the first and second shadow vias.

In some embodiments, the first and second signal vias have a center-to-center spacing in a range of 55 to 79 mils.

In some embodiments, the columns of via patterns have a center-to-center spacing in a range of 71 to 98 mils.

In some embodiments, the at least one antipad comprises a single antipad surrounding the first and second signal vias.

In some embodiments, the at least one antipad comprises a first antipad surrounding the first signal via and a second antipad surrounding the second signal via.

In some embodiments, first and second signal traces are connected to the first and second signal vias, respectively, in a breakout layer of the routing layers and wherein the first and second antipads in a layer below the breakout layer include ground plane projections toward the first and second signal vias underneath the first and second signal traces.

In some embodiments, each of the first and second signal traces includes a widened portion near the respective first and second signal vias.

In accordance with further embodiments, a printed circuit board comprises a plurality of layers including one or more planar conductive layers and one or more conductive trace layers; and columns of via patterns formed in one or more of the plurality of layers, wherein via patterns in adjacent columns are offset in a direction of the columns, each of the via patterns comprising: first and second vias of a first diameter connected to at least one of the conductive trace layers; and conductive vias of a second diameter smaller than the first diameter located between the first and second vias and connected to at least one of the planar conductive layers.

In accordance with further embodiments, a printed circuit board comprises a plurality of layers including attachment layers and routing layers, a top layer of the plurality of layers including a conductive surface film; and via patterns formed in the plurality of layers, each of the via patterns comprising first and second signal vias extending through at least the attachment layers; and at least one conductive shadow via electrically connected to the conductive surface film.

In some embodiments, the first and second signal vias form a differential signal pair.

In some embodiments, the via patterns are formed in columns and wherein via patterns in adjacent columns are offset in the direction of the columns.

In some embodiments, the at least one conductive shadow via is located between the first and second signal vias of the differential pair.

In some embodiments, the at least one shadow via includes two shadow vias located midway between the first and second signal vias.

In some embodiments, the at least one shadow via extends through the plurality of layers.

In some embodiments, the at least one shadow via is plated or filled with a conductive material.

In some embodiments, the printed circuit board further comprises additional shadow vias located between adjacent via patterns and electrically connected to the conductive surface film.

In some embodiments, each of the via patterns further comprises ground vias extending through at least the attachment layers, the ground vias including ground conductors.

In some embodiments, the first and second signal vias and the ground vias are configured to accept compliant pins of a connector.

In some embodiments, the conductive surface film is configured to contact a conductive element of a connector.

In some embodiments, each of the via patterns further comprises an antipad formed in the conductive surface film and surrounding the first and second signal vias.

In some embodiments, each of the via patterns further comprises a first antipad surrounding the first signal via and a second antipad surrounding the second signal via.

In some embodiments, the at least one shadow via comprises a slot-shaped shadow via.

In some embodiments, the additional shadow vias are electrically connected to the conductive surface film.

In accordance with further embodiments, a printed circuit board comprises a plurality of layers, a top layer of the plurality of layers including a conductive surface film; and via patterns formed in the plurality of layers, each of the via patterns comprising at least one signal via connected to a layer of the plurality of layers; and at least one conductive shadow via electrically connected to the conductive surface film.

BRIEF DESCRIPTION OF DRAWINGS

For a better understanding of the disclosed technology, reference is made to the accompanying drawings, which are incorporated herein by reference and in which.

DETAILED DESCRIPTION

The inventors have recognized and appreciated that, although substantial focus has been placed on providing improved electrical connectors in order to improve the performance of interconnection systems, at some very high frequencies significant performance improvement may be achieved by inventive designs for printed circuit boards. In accordance with some embodiments, improvements may be achieved by the incorporation of structures to alter the electrical properties of the printed circuit board in a connector footprint. The structures shown and described herein may be utilized in any type of printed circuit board, including but not limited to backplanes, mother boards, daughter boards, orthogonally mating daughter cards that mate with or without a midplane and daughter cards that mate to a cable.

Those structures, for example, may include conducting structures, known as vias, extending vertically through a printed circuit board. In some embodiments, the structures may be shadow vias which are plated or filled with conductive material through some or all of the layers of the printed circuit board. The shadow vias are not required to accept contact tails of the connector and are configured and positioned relative to signal vias to improve performance, particularly at high frequencies. In some embodiments, the shadow vias reduce crosstalk between signal vias in adjacent columns of signal vias in a connector footprint. In some embodiments, the shadow vias are located between signal vias of a differential signal pair.

Figure 1:
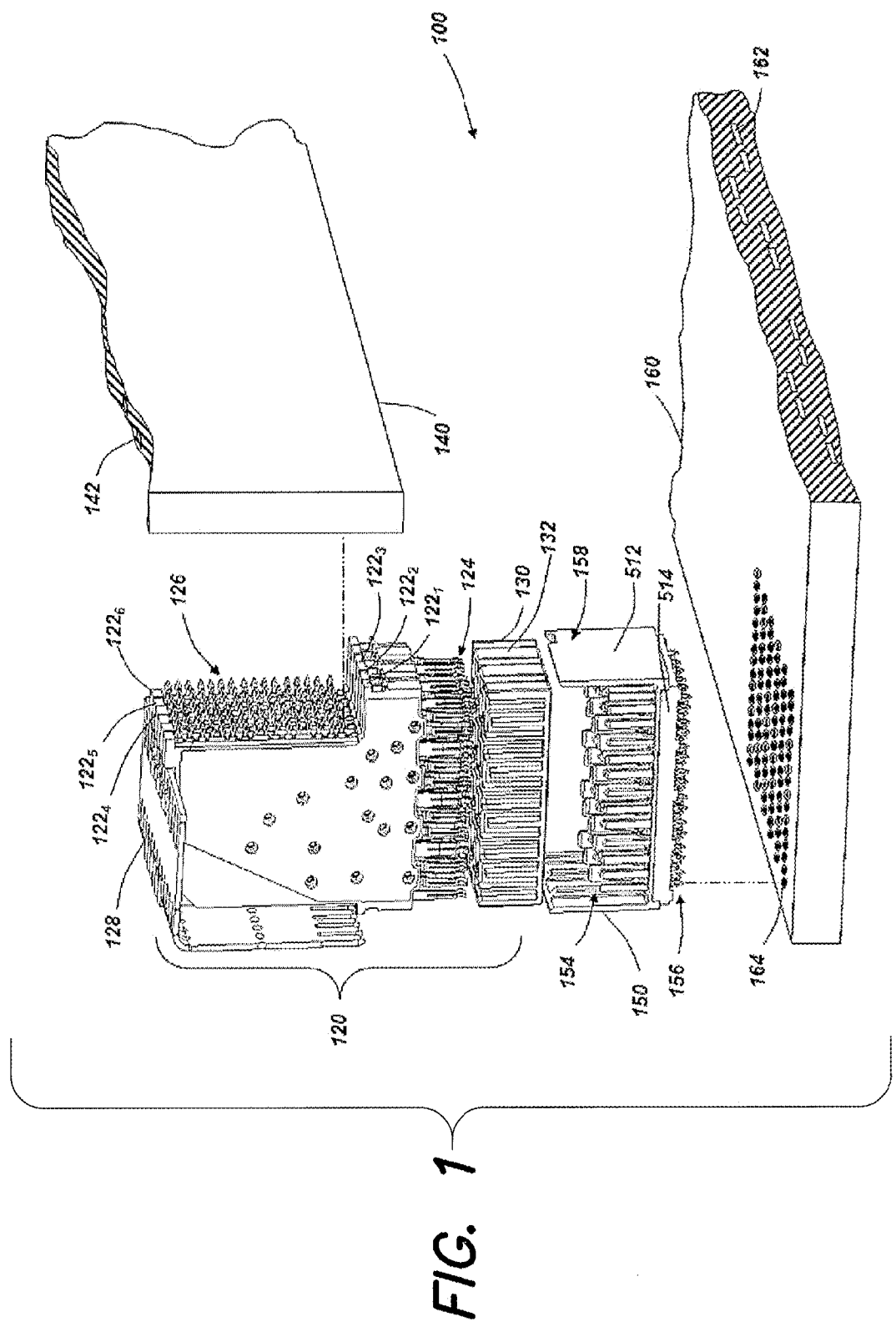
FIG. 1 is an exploded view of a high speed, high density electrical connector, a backplane and a daughter board.

Referring to FIG. 1, an electrical interconnection system 100 with two connectors is shown. The electrical interconnection system 100 includes a daughter card connector 120 and a backplane connector 150.

Daughter card connector 120 is designed to mate with backplane connector 150, creating electronically conducting paths between a backplane 160 and a daughter card 140. Though not expressly shown, interconnection system 100 may interconnect multiple daughter cards having similar daughter card connectors that mate to similar backplane connections on backplane 160. Accordingly, the number and type of subassemblies connected through an interconnection system is not a limitation.

FIG. 1 shows an interconnection system using a right-angle, separable mating interface connector. It should be appreciated that in other embodiments, the electrical interconnection system 100 may include other types and combinations of connectors, as the invention may be broadly applied in many types of electrical connectors, such as right-angle, separable mating interface connectors, mezzanine connectors and chip sockets.

Backplane connector 150 and daughter connector 120 each contains conductive elements. The conductive elements of daughter card connector 120 are coupled to traces, of which trace 142 is numbered, ground planes or other conductive elements within daughter card 140. The traces carry electrical signals and the ground planes provide reference levels for components on daughter card 140. Ground planes may have voltages that are at earth ground or positive or negative with respect to earth ground, as any voltage level may act as a reference level.

Similarly, conductive elements in backplane connector 150 are coupled to traces, of which trace 162 is numbered, ground planes or other conductive elements within backplane 160. When daughter card connector 120 and backplane connector 150 mate, conductive elements in the two connectors mate to complete electrically conductive paths between the conductive elements within backplane 160 and daughter card 140.

Backplane connector 150 includes a backplane shroud 158 and a plurality of conductive elements. The conductive elements of backplane connector 150 extend through floor 514 of the backplane shroud 158 with portions both above and below floor 514. Here, the portions of the conductive elements that extend above floor 514 form mating contacts, shown collectively as mating contact portions 154, which are adapted to mate to corresponding conductive elements of daughter card connector 120. In the illustrated embodiment, mating contacts 154 are in the form of blades, although other suitable contact configurations may be employed, as the disclosed technology is not limited in this regard.

Tail portions, shown collectively as contact tails 156, of the conductive elements extend below the shroud floor 514 and are adapted to be attached to backplane 160. Here, the tail portions are in the form of a press fit, "eye of the needle" compliant sections that fit within via holes, shown collectively as via holes 164, on backplane 160. However, other configurations are also suitable, such as surface mount elements, spring contacts, solderable pins, etc., as the disclosed technology is not limited in this regard.

Daughter card connector 120 includes a plurality of wafers 1221 . . . 1226 coupled together, with each of the plurality of wafers 1221 . . . 1226 having a housing and a column of conductive elements. In the illustrated embodiment, each column has a plurality of signal conductors and a plurality of ground conductors as discussed below. The ground conductors may be employed within each wafer 1221 . . . 1226 to minimize crosstalk between signal conductors or to otherwise control the electrical properties of the connector.

In the illustrated embodiment, daughter card connector 120 is a right angle connector and has conductive elements that traverse a right angle. As a result, opposing ends of the conductive elements extend from perpendicular edges of the wafers 1221 . . . 1226.

Each conductive element of wafers 1221 . . . 1226 has at least one contact tail, shown collectively as contact tails 126 that can be connected to daughter card 140. Each conductive element in daughter card connector 120 also has a mating contact portion, shown collectively as mating contacts 124, which can be connected to a corresponding conductive element in backplane connector 150. Each conductive element also has an intermediate portion between the mating contact portion and the contact tail, which may be enclosed by or embedded within a wafer housing.

The contact tails 126 electrically connect the conductive elements within daughter card and connector 120 to conductive elements, such as traces 142 in daughter card 140. In the embodiment illustrated, contact tails 126 are press fit "eye of the needle" contacts that make an electrical connection through via holes in daughter card 140. However, any suitable attachment mechanism may be used instead of or in addition to via holes and press fit contact tails.

In the illustrated embodiment, each of the mating contacts 124 has a dual beam structure configured to mate to a corresponding mating contact 154 of backplane connector 150. The conductive elements acting as signal conductors may be grouped in pairs, separated by ground conductors in a configuration suitable for use as a differential electrical connector. However, embodiments are possible for single-ended use in which the conductive elements are evenly spaced without designated ground conductors separating signal conductors or with a ground conductor between each signal conductor.

In the embodiments illustrated, some conductive elements are designated as forming a differential pair of conductors and some conductive elements are designated as ground conductors. These designations refer to the intended use of the conductive elements in an interconnection system as they would be understood by one of skill in the art. For example, though other uses of the conductive elements may be possible, differential pairs may be identified based on preferential coupling between the conductive elements that make up the pair. Electrical characteristics of the pair, such as its impedance, that make it suitable for carrying a differential signal may provide an alternative or additional method of identifying a differential pair. As another example, in a connector with differential pairs, ground conductors may be identified by their positioning relative to the differential pairs. In other instances, ground conductors may be identified by their shape or electrical characteristics. For example, ground conductors may be relatively wide to provide low inductance, which is desirable for providing a stable reference potential, but provides an impedance that is undesirable for carrying a high speed signal.

For exemplary purposes only, daughter card connector 120 is illustrated with six wafers 1221 . . . 1226, with each wafer having a plurality of pairs of signal conductors and adjacent ground conductors. As pictured, each of the wafers 1221 . . . 1226 includes one column of conductive elements. However, the disclosed technology is not limited in this regard, as the number of wafers and the number of signal conductors and ground conductors in each wafer may be varied as desired.

As shown, each wafer 1221 . . . 1226 is inserted into front housing 130 such that mating contacts 124 are inserted into and held within openings in front housing 130. The openings in front housing 130 are positioned so as to allow mating contacts 154 of the backplane connector 150 to enter the openings in front housing 130 and allow electrical connection with mating contacts 124 when daughter card connector 120 is mated to backplane connector 150.

Daughter card connector 120 may include a support member instead of or in addition to front housing 130 to hold wafers 1221 . . . 1226. In the pictured embodiment, stiffener 128 supports the plurality of wafers 1221 . . . 1226. Stiffener 128 is, in the embodiment illustrated, a stamped metal member. However, stiffener 128 may be formed from any suitable material. Stiffener 128 may be stamped with slots, holes, grooves or other features that can engage a wafer.

Figure 2:
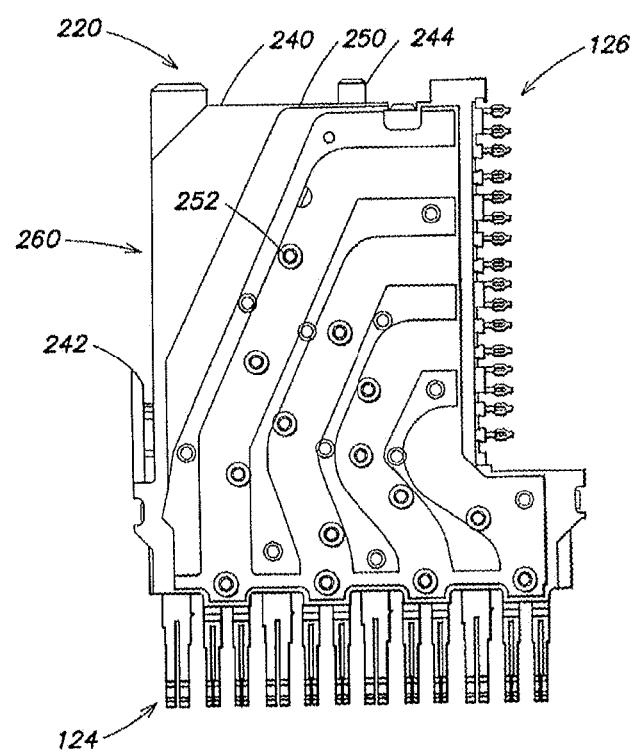
FIG. 2 is a side view of a wafer forming a portion of the electrical connector of FIG. 1.

A side view of a wafer 220 is shown in FIG. 2. Wafer 220 may correspond to each of wafers 1221, 1222, . . . , 1226 shown in FIG. 1. Wafer 220 includes a housing 260 with conductors interconnecting contact tails 126 and mating contacts 124. Wafer 220 further includes insulative portions 240 and lossy portions 250, as well as attachment elements 242 and 244. Further details regarding wafer 220 are provided in U.S. Pat. No. 7,794,278, which is hereby incorporated by reference.

Figure 3:
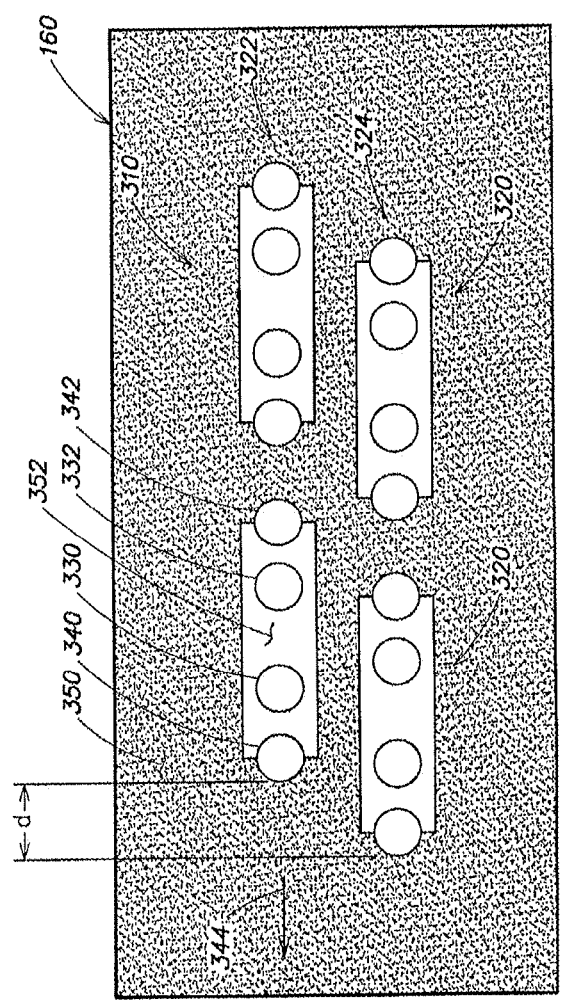
FIG. 3 is a partial top view of a connector footprint on a printed circuit board, corresponding to two wafers in the electrical connector of FIG. 1.

An example of a printed circuit board is described with reference to FIGS. 3 and 4. A partial top view of backplane 160 showing a connector footprint 310 of vias for mating with the contact tails of backplane connector 150 is shown in FIG. 3. The backplane 160 may be implemented as a printed circuit board as described below. As shown, the connector footprint 310 includes an array of columns of via patterns 320. Each via pattern 320 corresponds to one differential pair of signal conductors and associated reference conductors.

Columns 322 and 324 are shown in FIG. 3. A complete connector footprint includes one column for each wafer in connector 120. Thus, the connector footprint 170 of FIG. 1 includes six columns. However, the number of columns is not limited and may correspond to the number of wafers in the mating connector. As further shown in FIG. 3, adjacent columns 322 and 324 are offset by a distance d in a direction 344 of the columns. The offset distance d may be on the order of one half the distance between the centers of signal vias 330 and 332. However, this is not a limitation.

As shown, each via pattern 320 includes a first signal via 330 and a second signal via 332, which form a differential signal pair, and ground vias 340 and 342 associated with each pair of signal vias 330, 332. It will be understood that each of the via patterns 320 matches a pattern of contact tails of backplane connector 150 shown in FIG. 1 and described above. In particular, each column of via patterns 320 corresponds to one of the columns of contact tails of backplane connector 150. It will be understood that the parameters of the connector footprint 310 may vary, including the number and arrangement of via patterns 320 and the configuration of each via pattern 320, provided that the connector footprint 310 matches the pattern of contact tails in backplane connector 150.

In forming the backplane 160, a ground plane 350 is partially removed, such as by patterning a copper layer on a laminate, to form an antipad 352, forming a ground clearance surrounding signal vias 330 and 332, so that the dielectric sheet of the attachment layer is exposed. The areas where the ground plane is removed may be called "non-conductive areas" or "antipads". The antipad 322 has a size and shape to preclude shorting of ground plane 350 to signals vias 330 and 332, even if there is some imprecision in forming the signal vias relative to the ground plane, and to establish a desired impedance of the signal path formed by signal vias 330 and 332. In FIG. 3, the antipad 352 is rectangular in shape. However, the antipad 352 can have any suitable shape and may have rounded corners.

Figure 4:
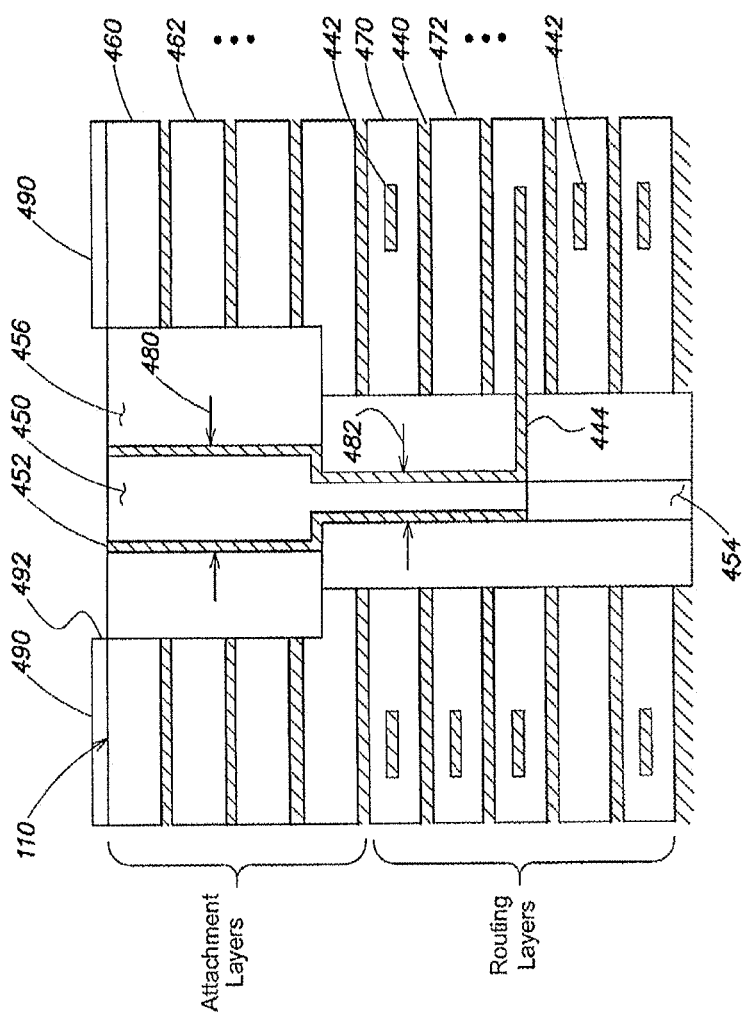
FIG. 4 is a partial cross-section of a printed circuit board.

A simplified cross-sectional view of a portion of backplane 160 in accordance with embodiments is shown in FIG. 4. The portion shown may be representative of a signal via in a connector footprint. FIG. 4 shows the layered structure of backplane 160 and a signal via 450 for purposes of illustration. It will be understood that an actual backplane 160 includes multiple, closely-spaced vias in particular patterns as described below. The backplane 160 may be implemented as a printed circuit board.

As shown in FIG. 4, the backplane 160 includes multiple layers. Each layer of the multiple layers of backplane 160 may include a conductive layer and a dielectric sheet, so that the backplane 160 includes an alternating arrangement of conductive layers and dielectric sheets. Each conductive layer may serve as a ground plane, may be patterned to form conductive traces, or may include a ground plane and conductive traces in different areas. The layers may be formed, during assembly, by stacking multiple sheets of laminate with patterned copper and pre-preg and then pressing them under heat to fuse all the sheets. Patterning the copper may create traces and other conductive structures within the printed circuit board. As a result of fusing, the layers may not be structurally separable in a finished backplane. However, the layers may nonetheless be recognized in the fused structure based on the position of the conductive structures.

The layers may be allocated for different functions and accordingly may have different structural characteristics. In some embodiments, a first portion of the layers, those nearest a surface, may have vias of sufficient diameter to receive contact tails of a connector mounted to the surface. These layers may be called "attachment layers". A second portion of the layers may have vias of smaller diameter, providing additional area for signal routing. These layers may be called "routing layers".

In the illustrated embodiment, the backplane 160 includes attachment layers 460, 462, etc. and routing layers 470, 472, etc. The attachment layers are located in an upper portion of the backplane 160, and the routing layers are located below the attachment layers. The attachment layers 460, 462, etc. and the routing layers 470, 472, etc. are adhered together to form a single structure in the form of a printed circuit board. The number of attachment layers and the number of routing layers in a particular backplane may vary according to application.

As shown in FIG. 4, backplane 160 may include ground planes 440 between the layers of the structure and may include signal traces 442 in or between the routing layers. A signal trace 444 is shown as connected to signal via 450.

The signal via 450 includes plating 452 in the attachment layers and in one or more of the routing layers. The signal via 450 may be back drilled in a lower region 454 of the backplane 160 to remove the plating. A ground clearance 456 is provided between signal via 450 and the ground planes 440.

As further shown in FIG. 4, the signal via 450 has a first diameter 480 in the attachment layers and a second diameter 482 in the routing layers. The first diameter 480 is larger than the second diameter 482. In particular, the first diameter 480 is selected to accept a contact tail of the backplane connector 150, and the second diameter 482 is selected in accordance with typical via diameters for printed circuit boards. Because the signal via 450 has a relatively large first diameter 480 and because the vias are closely spaced to match high density backplane connector 150, little area remains in attachment layers 460, 462, etc. for signal routing. In routing layers 470, 472, etc. which are below the vias of the attachment layers, additional area is available for signal routing.

In some embodiments, the vias may have the same diameter in the attachment layers and in the routing layers. For example, the contact elements of the connector may attach to pads on the surface of the backplane 160 in a surface mount configuration.

In some embodiments, the backplane 160 may include a conductive surface layer 490 on its top surface. The conductive surface layer 490 is patterned to provide an antipad 492, or non-conductive area, around each of the signal vias. The conductive surface layer 490 may be connected to some or all of the ground vias and may provide a contact for a connector ground, such as a conductive gasket pressed between the printed circuit board and a connector mounted to the printed circuit board or a conductive finger extending from a connector or other component attached to the printed circuit board. The conductive gasket and/or the conductive finger may provide current flow paths between grounding structures in the connector and in the printed circuit board, increasing the effectiveness of the ground structures and enhancing signal integrity.

Figure 5A:
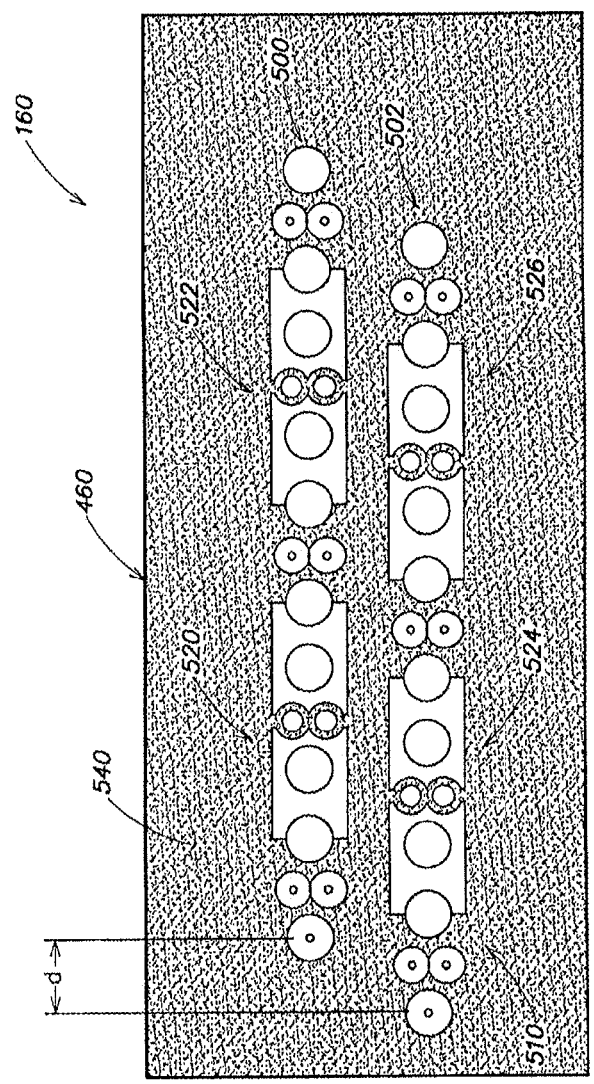
FIG. 5A is a partial top view of a connector footprint on a printed circuit board, in accordance with embodiments.

Embodiments of a printed circuit board are described with reference to FIGS. 5A, 5B and 6. A partial top view of an embodiment of an attachment layer, such as attachment layer 460, of the backplane 160 is shown in FIG. 5A. In the case of multiple attachment layers, each of the attachment layers of backplane 160 may have the same configuration. FIG. 5A shows two columns 500 and 502 of a connector footprint 510. Each of columns 500 and 502 includes via patterns, with each via pattern corresponding to a differential signal pair. Thus, column 500 includes via patterns 520 and 522, and column 502 includes via patterns 524 and 526.

As further shown in FIG. 5A, adjacent columns 500 and 502 may be offset by a distance d in a direction of the columns 500 and 502. The offset distance d may be on the order of one half the distance between the centers of the signal vias 530 and 532 (FIG. 5B). However, this is not a limitation.

In implementations of the printed circuit board, each of columns 500 and 502 may include additional via patterns and the connector footprint 510 may include additional columns of via patterns. The number of via patterns in a column and the number of columns in a connector footprint are not limitations. In general, the number of columns in the connector footprint 510 may correspond to the number of wafers in connector 120 (FIG. 1) and the number of via patterns in each column may correspond to the number of differential signal pairs in each wafer.

It should be appreciated that FIG. 5A is partially schematic in that all of the illustrated structures may not in all embodiments be seen in a visual inspection of the top of a printed circuit board. A coating that obscures some of the structures may be placed over the board. In addition, some structures may be formed on layers below the surface of the board. Those layers may nonetheless be shown in a top view so that the relative positions of the structures in the layers may be understood. For example, signal traces and ground planes may not both be visible in the same view of the board, as they are on different vertical planes within the printed circuit board. However, because the relative positioning of signal and ground structures may be important to performance of a printed circuit board, both may be shown in what is referred to as a top view.

Figure 5B:
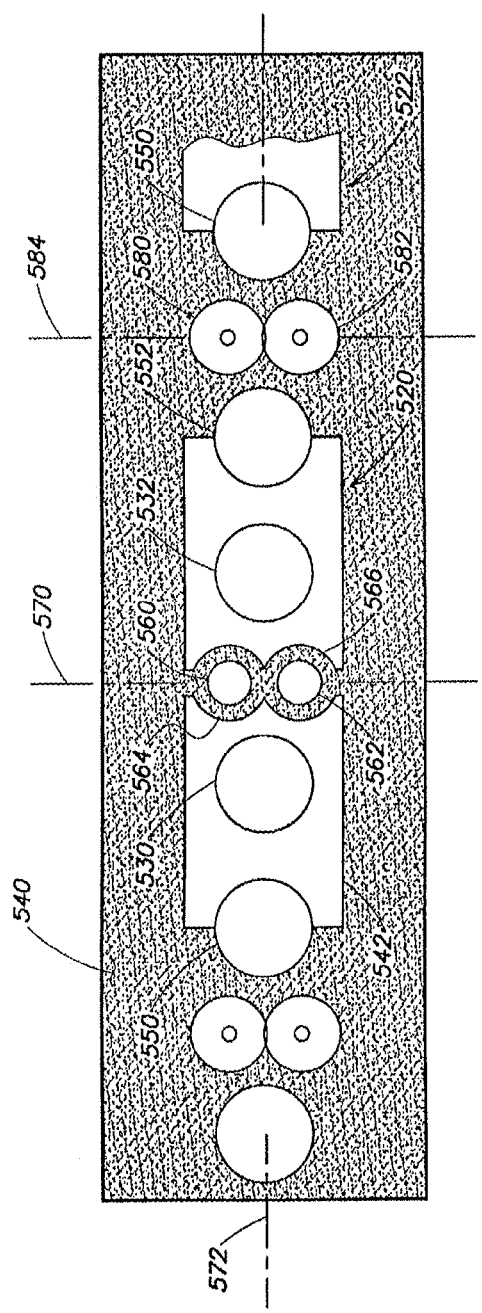
FIG. 5B is an enlarged top view of one of the via patterns shown in FIG. 5A, in accordance with embodiments.

An enlarged top view of via pattern 520 is shown in FIG. 5B. Each of the via patterns 520, 522, 524, 526 may have the same configuration. In the example of FIGS. 5A and 5B, each via pattern 520, 522, 524, 526 of attachment layer 460 includes a first signal via 530 and a second signal via 532, which form a differential signal pair. The signal vias 530 and 532 extend vertically through the attachment layers and may have diameters in the attachment layers that are selected to accept the contact tails 156 of backplane connector 150. In forming the board, a ground plane 540 is partially removed, such as by patterning a copper layer on a laminate, to form an antipad 542, forming a ground clearance between ground plane 540 and signal vias 530 and 532, so that the dielectric sheet of the attachment layer 460 is exposed. The antipad 542 has a size and shape to preclude shorting of ground plane 540 to signal vias 530 and 532, even if there is some imprecision in forming the vias relative to ground plane 540, and to establish a desired impedance of the signal path formed by signal vias 530 and 532. In the embodiment of FIGS. 5A and 5B, antipad 542 is rectangular in shape, and the signal vias 530 and 532 are centrally located in antipad 522. However, the antipad 522 may have any suitable shape and may have rounded corners.

Each via pattern 520, 522, 524, 526 of attachment layer 460 may further include ground vias 550 and 552 associated with signal vias 530 and 532. In this example, ground via 550 is located near one end of via pattern 520 adjacent to signal via 530, and ground via 552 is located near an opposite end of via pattern 520 adjacent to signal via 532. In the example of FIGS. 5A and 5B, the ground vias 550 and 552 overlap respective ends of antipad 542. The ground vias 550 and 552 may be dimensioned to accept corresponding contact tails 156 of backplane connector 150. The ground vias interconnect the ground planes of some or all of the layers of the backplane 160. In particular, the ground vias may extend through all of the layers of the backplane 160 and may be plated with a conductive material.

Each via pattern 520, 522, 524, 526 of attachment layer 460 further includes shadow vias 560 and 562 located between the first signal via 530 and the second signal via 532 of the differential signal pair. The shadow vias 560 and 562 do not accept contact tails of backplane connector 150 and may have a smaller diameter than the signal vias and the ground vias. The shadow vias 560 and 562 may extend through the layers of the backplane 160 and may be plated or filled with a conductive material to form conductive shadow vias.

As indicated above, the shadow vias 560 and 562 are located between signal vias 530 and 532. As shown in FIG. 5B, shadow vias 560 and 562 are located on a first line 570 that is perpendicular to a second line 572 that passes through signal vias 530 and 532 in a direction of the columns 500, 502. The first line 570 may be located midway between signal vias 530 and 532, such that the shadow vias 560 and 562 are equally spaced from signal vias 530 and 532. In addition, the shadow vias 560 and 562 may at least partially overlap the edges of antipad 542, thus effectively electrically shorting opposite sides of antipad 542 between signal vias 530 and 532 and dividing antipad 542 into two separate antipad sections respectively surrounding signal vias 530 and 532.

The shadow vias 560 and 562 include pads 564 and 566, respectively. In some embodiments, the pads of the shadow vias 560 and 562 physically and electrically contact each other, while in other embodiments the pads of the shadow vias 560 and 562 are spaced apart and do not contact each other.

In the example of FIG. 5A, each of via patterns 520, 522, 524 and 526 includes two shadow vias located between the signal vias of each differential signal pair. In further embodiments, each via pattern may include a single shadow via located between the signal vias or more than two shadow vias. Furthermore, the shadow vias may be implemented as one or more circular shadow vias or one or more slot-shaped shadow vias.

The connector footprint 510 shown in FIGS. 5A and 5B may further include additional shadow vias between adjacent via patterns in each column. As shown in FIG. 5B, shadow vias 580 and 582 are located between via patterns 520 and 522 and, more particularly, between ground via 552 of via pattern 520 and ground via 550 of via pattern 522. Additional shadow vias may be located between the other via patterns as well. The additional shadow vias 580 and 582 do not accept contact tails of backplane connector 150 and may have a smaller diameter than the signal vias and the ground vias. The additional shadow vias 580 and 582 may, for example, have the same diameters as the shadow vias 560 and 562 located between the signal vias of the differential signal pair. The additional shadow vias 580 and 582 may extend through the layers of the backplane 160 and may be plated or filled with a conductive material.

In the example of FIGS. 5A and 5B, additional shadow vias 580 and 582 may be located on a third line 584 that is perpendicular to second line 572 and is located midway between ground vias 552 and 550 of adjacent via patterns. The additional shadow vias 580 and 582 may be equally spaced from ground vias 550 and 552 of adjacent via patterns. Further, the additional shadow vias 580 and 582 are located outside the antipad 542 of each via pattern.

In the example of FIGS. 5A and 5B, two additional shadow vias are located between the adjacent via patterns in each column 500, 502 of the connector footprint 510. In further embodiments, the connector footprint may include a single additional shadow via located between the ground vias of adjacent via patterns or more than two additional shadow vias. Furthermore, the additional shadow vias may be implemented as one or more circular shadow vias or one or more slot-shaped shadow vias.

Figure 6:
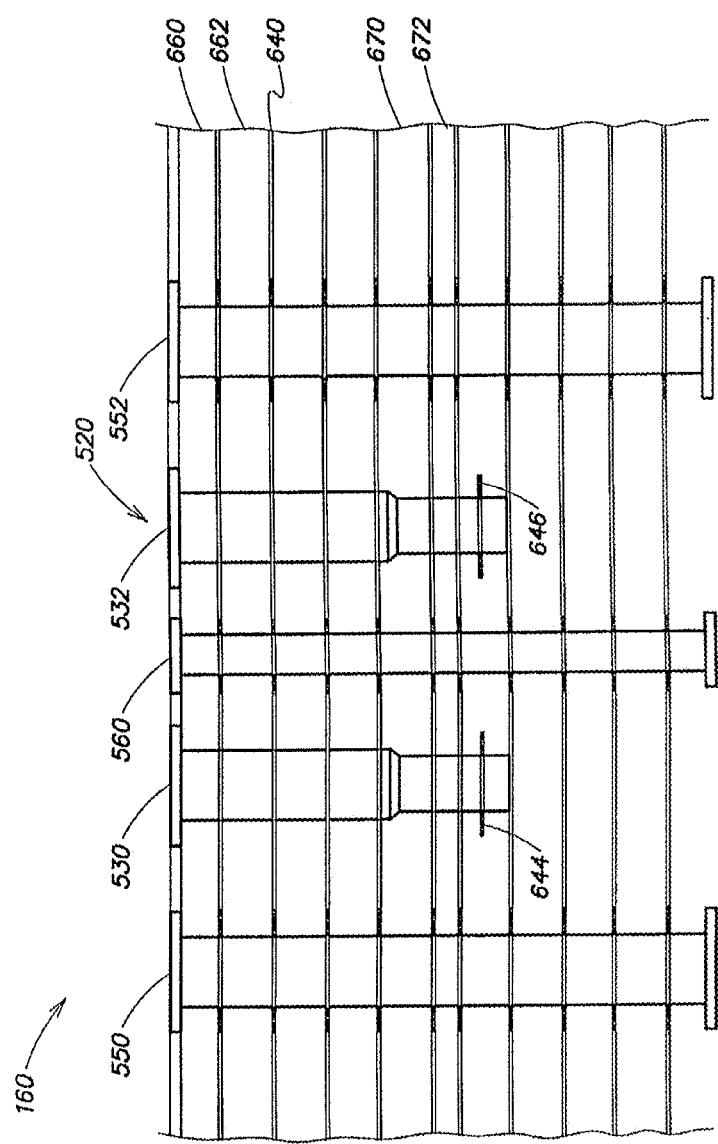
FIG. 6 is a partial cross section of the printed circuit board of FIG. 5, in accordance with embodiments.

A simplified cross-sectional view of a portion of backplane 160 in accordance with embodiments is shown in FIG. 6. The portion shown may be representative of via pattern 520 in connector footprint 510. FIG. 6 shows the layered structure of backplane 160 in via pattern 520 for purposes of illustration. It will be understood that an actual backplane includes multiple via patterns as described herein. The backplane 160 may be implemented as a printed circuit board.

As shown in FIG. 6, the backplane 160 includes multiple layers. Each layer of the multiple layers of backplane 160 may include a conductive layer and a dielectric sheet, so that the backplane 160 includes an alternating arrangement of conductive layers and dielectric sheets. Each conductive layer may serve as a ground plane, may be patterned to form conductive traces or may include a ground plane and conductive traces in different areas. The layers may be formed, during assembly, by stacking multiple sheets of laminate with patterned copper and pre-preg and then pressing them under heat to fuse all the sheets. Patterning the copper may create traces and other conductive structures within the printed circuit board. As a result of fusing, the layers may not be structurally separable in a finished backplane. However, the layers may nonetheless be recognized in the fused structure based on the position of the conductive structures.

The layers may be allocated for different functions and accordingly may have different structural characteristics. In some embodiments, a first portion of the layers, those nearest the surface, may have vias of sufficient diameter to receive contact tails of a connector mounted to the surface. These layers may be called "attachment layers". A second portion of the layers may have vias of smaller diameter, providing additional area for signal routing. These layers may be called "routing layers".

In the illustrated embodiment, the backplane 160 includes attachment layers 660, 662, etc. and routing layers 670, 672, etc. The attachment layers are located in the upper portion of the backplane 160, and the routing layers are located below the attachment layers. The attachment layers 660, 662, etc. and the routing layers 670, 672, etc. are adhered together to form a single structure in the form of a printed circuit board. The number of attachment layers and the number of routing layers in a particular backplane may vary according to application.

As shown in FIG. 6, backplane 160 may include ground planes 640 between the layers of the structure and may include signal traces in or between the routing layers. It will be understood that the ground planes 640 do not contact the signal vias 530 and 532 and may be separated from the signal vias by providing antipad 542 (FIG. 5B). A signal trace 644 is shown as connected to signal via 530, and a signal trace 646 is shown as connected to signal via 532.

The signal vias 530 and 532 include plating in the attachment layers and in one or more of the routing layers. The signal vias 530 and 532 may be backdrilled in the lower region of the backplane 160 to remove the plating.

As further shown in FIG. 6, the signal vias 530 and 532 may have a first diameter in the attachment layers and a second diameter in the routing layers, where the first diameter is larger than the second diameter. In particular, the first diameter is selected to accept a contact tail of the backplane connector 150, and the second diameter is selected in accordance with typical via diameters for printed circuit boards.

In one non-limiting example, the first diameter of signal vias 530 and 532 in the attachment layers is 15.7 mils and the second diameter in the routing layers is 11 mils. These diameters are primary drill diameters. The primary drill diameter is the size of the hole before the printed circuit plating process. The center-to-center spacing of the signal vias 530 and 532 may be in a range of 55 mils (1.2 mm) to 79 mils (2.0 mm), and the center-to-center spacing between columns of via patterns may be in a range of 71 mils (1.8 mm) to 98 mils (2.5 mm). In this example, the shadow vias 560, 562 have primary drill diameters of 13.8 mils and are equally spaced from signal vias 530 and 532. The ground vias 550 and 552 may have primary drill diameters of 15.7 mils, and the additional shadow vias 580, 582 may have primary drill diameters of 13.8 mils. The signal vias 530 and 532 may have primary drill diameters in a range of 14 to 22 mils, and the shadow vias 560 and 562 may have primary drill diameters in a range of 8 to 14 mils. The signal vias may be 3 to 6 mils larger in diameter than the shadow vias. The signal vias are dimensioned to accept contact tails of the connector, whereas the shadow vias are dimensioned in accordance with typical via diameters of the printed circuit board. It will be understood that these dimensions are not limiting and that other dimensions may be utilized.

Figure 7:
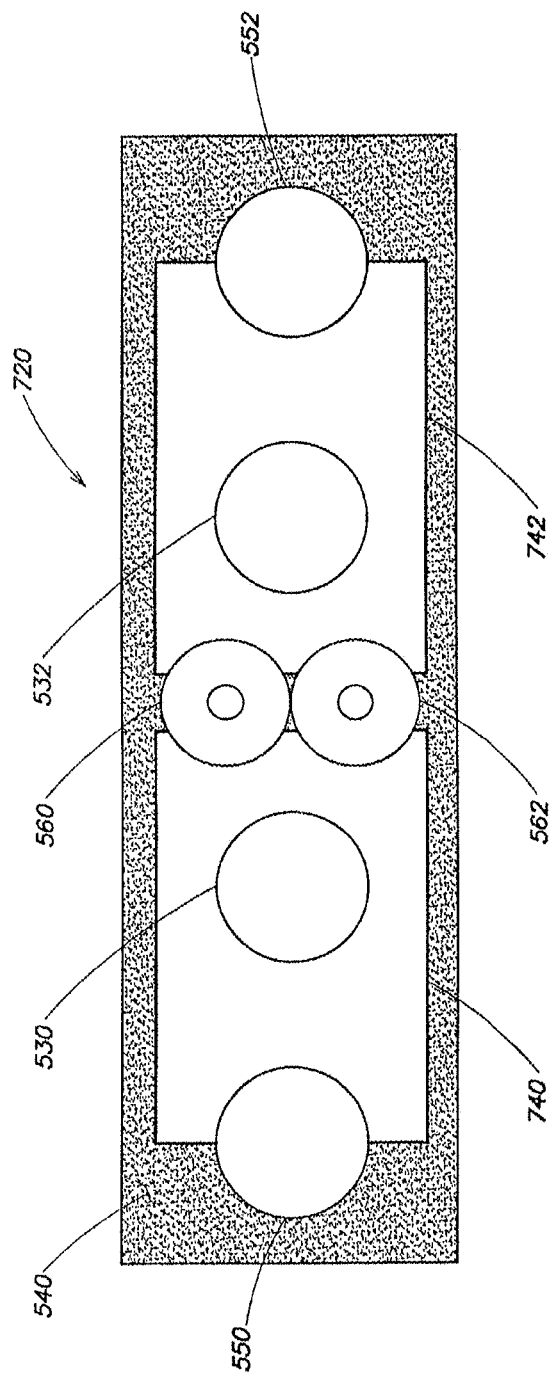
FIG. 7 is an enlarged top view of a via pattern of a connector footprint of a printed circuit board, in accordance with embodiments.
Figure 8:
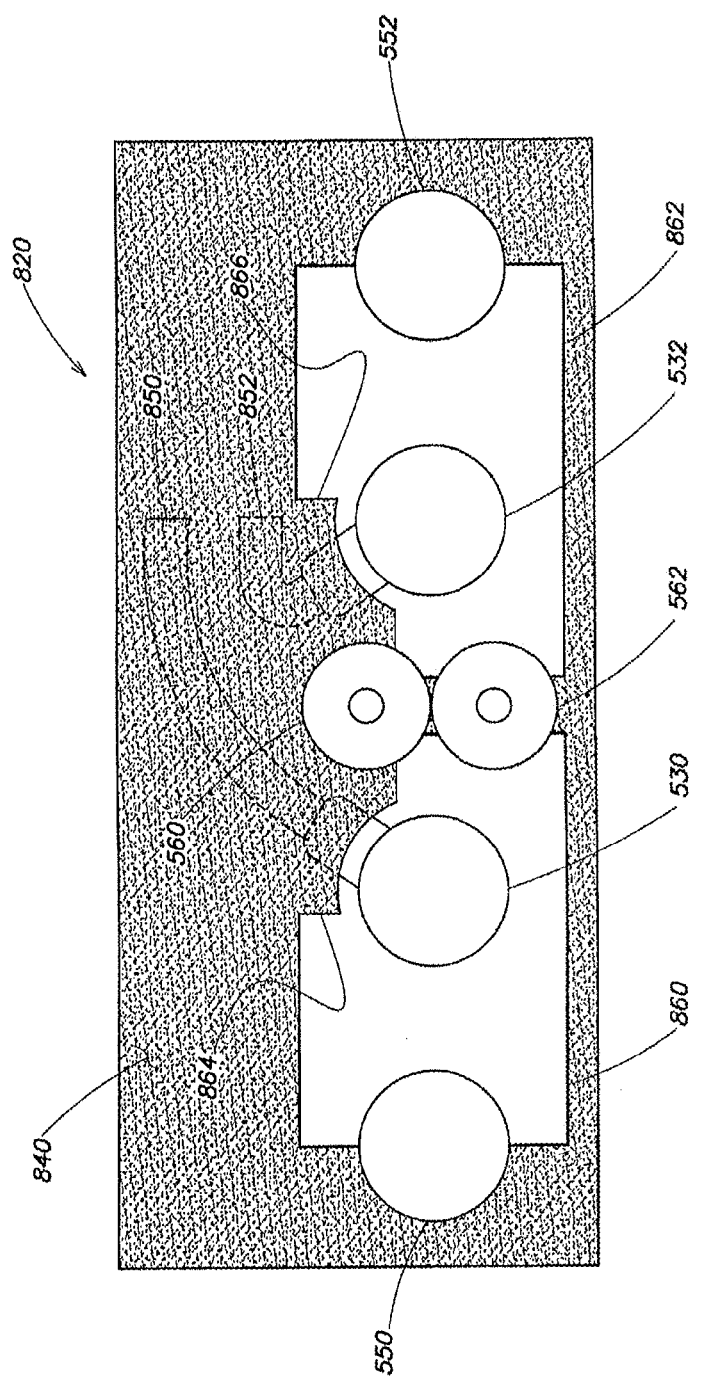
FIG. 8 is an enlarged top view of a via pattern in a signal breakout layer, in accordance with embodiments.

Further embodiments of a printed circuit board are described with reference to FIGS. 7 and 8. An enlarged top view of a via pattern 720 is shown in FIG. 7. The via pattern 720 may be the same in all of the layers of the printed circuit board above a signal breakout layer. An enlarged top view of a via pattern 820 is shown in FIG. 8. The via pattern 820 may be used in the signal breakout layer and shows an antipad configuration in a layer below the signal breakout layer.

The via pattern 720 of FIG. 7 may have the same configuration as the via pattern 520 of FIG. 5B, except for the antipad configuration. In particular, via pattern 720 includes a first antipad 740 that surrounds signal via 530 and a second antipad 742 that surrounds signal via 532. Each of the antipads 740 and 742 is an area of the respective layer of the printed circuit board where ground plane 540 is removed, such as by patterning a copper layer on a laminate, to form a ground clearance between the ground plane 540 and the signal vias 530 and 532. The antipads 740 and 742 have a size and shape to preclude shorting of ground plane 540 to signal vias 530 and 532, even if there is some imprecision in forming the vias relative to the ground plane 540, and to establish a desired impedance of the signal path formed by signal vias 530 and 532.

In the embodiment of FIG. 7, the antipads 740 and 742 are rectangular in shape, and the signal vias 530 and 532 are more or less centrally located in the respective antipads 740 and 742. However, the antipads 740 and 742 may have any suitable shape and may have rounded corners. As shown in FIG. 7, ground via 550 is located on one edge of antipad 740, and shadow vias 560 and 562 are located on an opposite edge of antipad 740. Similarly, ground via 552 is located on one edge of antipad 742, and shadow vias 560 and 562 are located on an opposite edge of antipad 742.

The embodiment of FIG. 7 provides two distinct antipads 740 and 742, one for each of the signal vias 530 and 532, independent of the configuration of shadow vias 560 and 562. In contrast, the embodiment of FIG. 5B provides a single antipad 542 that surrounds signal vias 530 and 532. In the embodiment of FIG. 5B the shadow vias 560 and 562 may form a conductive bridge across antipad 542, depending on the size and location of shadow vias 560 and 562. However, the shadow vias 560 and 562 do not necessarily form a bridge across antipad 542 in the embodiment of FIG. 5B.

In the embodiment of FIG. 8, a routing layer that serves a signal breakout layer for the signal vias 530 and 532 is shown. The via pattern 820 of FIG. 8 may be located in the routing layers below the via pattern 720 of FIG. 7. As shown, a signal trace 850 connects to signal via 530, and a signal trace 852 connects to signal via 532. Each of the signal traces 850 and 852 has a first width throughout most of its length and a second width near the respective signal vias 530 and 532, wherein the second width is greater than the first width. The wider portions near signal vias 530 and 532 are provided to control impedance in the regions near the transition to the signal vias 530 and 532.

The via pattern 820 further includes a first antipad 860 which surrounds signal via 530 and a second antipad 862 which surrounds the signal via 532. The antipads 860 and 862 may correspond to the antipads 740 and 742, respectively, of FIG. 7 except that antipad 860 includes a ground plane projection 864, and antipad 862 includes a ground plane projection 866. Each of the projections 864 and 866 is an area of ground plane 840 that projects into the respective antipad toward the signal vias and is located underneath the respective signal traces 850 and 852. As shown, each of the projections 864 and 866 may be curved to correspond to the curvature of the respective signal vias 530 and 532. The projections 864 and 866 are located close to, but do not physically or electrically contact, the signal vias 530 and 532. The projections 864 and 866 provide a more controlled impedance connection between the signal traces 850 and 852 and the signal vias 530 and 532 than is the case where the signal traces pass over a substantial area of the antipad where the ground plane 840 has been removed. In particular, the transmission lines where the signal traces are spaced from the ground plane 840 extend almost to the signal vias 530 and 532.

As described above, the printed circuit boards shown FIGS. 5A, 5B, 7 and 8 and described above may include shadow vias 560 and 562 located between signal vias 530 and 532, and may include additional shadow vias 580 and 582 located between adjacent via patterns. The shadow vias 560, 562, 580 and 582 may be conductive shadow vias that are plated or filled with a conductive material.

The printed circuit boards may also include ground plane 540, referred to herein as a conductive surface film 540, on its top surface. The conductive surface film 540 may be electrically connected to ground. The conductive surface film 540 may be formed on an uppermost dielectric layer of the printed circuit board and may be patterned to form antipads, such as antipad 542. The conductive surface film 540 covers the entire surface of the printed circuit board, except in areas, such as antipads, where it is removed by a patterning process. In particular, the conductive surface film 540 surrounds each of the via patterns and surrounds each of the antipads of the printed circuit board.

In some embodiments, the conductive shadow vias of each via pattern may be electrically connected to the conductive surface film 540. For example, as shown in FIG. 5B, shadow vias 560 and 562 overlap the edges of antipad 542 and thus are in electrical contact with conductive surface film 540. In particular, shadow vias 560 and 562 may include pads 564 and 566, respectively, which are electrically connected to conductive surface film 540. As further shown in FIG. 5B, additional shadow vias 580 and 582 are electrically connected to conductive surface film 540. By providing grounded shadow vias in close proximity to signal vias 530 and 532, the connector footprints disclosed herein exhibit improved performance.

The ground vias are also electrically connected to the conductive surface film. As shown in FIG. 5B, ground vias 550 and 552 overlap the edge of antipad 542 and are electrically connected to conductive surface film 540.

Backplane connector 150 shown in FIG. 1 and described above may include an electrical contact for a connector ground, such as a conductive gasket, a conductive finger, or other conductive element. The connector ground may be in electrical contact with the conductive surface film 540 after the connector is installed on the printed circuit board, thereby establishing electrical continuity between the ground of the connector and the ground of the printed circuit board. The conductive gasket, conductive finger or other conductive element may be in physical and electrical contact with conductive surface film 540 but is not attached to the conductive surface film 540, such that the two elements are separable. This configuration is in contrast to the contact tails of the connector, which may be inserted into and soldered to respective signal vias and ground vias of the printed circuit board. The conductive gasket may be pressed between the printed circuit board and a connector mounted to the printed circuit board. The conductive finger may extend from a connector or other component attached to the printed circuit board. The conductive gasket and/or the conductive finger may provide current flow paths between grounding structures in the connector and in the printed circuit board, increasing the effectiveness of the ground structures and enhancing signal integrity.

It will be understood that the electrical connection between the conductive shadow vias and the conductive surface film is not limited to the via patterns shown in FIGS. 5A, 5B, 7 and 8. The conductive shadow vias may be electrically connected to a conductive surface film in any via pattern which has a conductive surface film and which utilizes conductive shadow vias.

In embodiments in which a printed circuit board includes a conductive surface layer, such as conductive surface layer 490 or conductive surface film 540, that is contacted by a conductive structure connecting ground structures within a connector or other component to grounds within the printed circuit board, shadow vias may be positioned to shape the current flow through the conductive surface layer. Conductive shadow vias may be placed near contact points on the conductive surface layer of members that connect to the ground structure of the connector. For example, if a conductive gasket or conductive finger makes such a connection, shadow vias may be preferentially positioned near contact points of the gasket or conductive finger on the conductive surface layer. This positioning of shadow vias limits the length of a primary conductive path from that contact point to a via that couples that current flow into the inner ground layers of the printed circuit board.

Limiting current flow in the ground conductors in a direction parallel to the surface of the board, which is perpendicular to the direction of signal current flow, may improve signal integrity. In some embodiments, the shadow vias may be positioned such that the length of a conducting path through the surface layer to the nearest shadow via coupling the conductive surface layer to an inner ground layer may be less than the thickness of the printed circuit board. In some embodiments, the conducting path through the surface layer may be less than 50%, 40%, 30%, 20% or 10% of the thickness of the board.

In some embodiments, shadow vias may be positioned so as to provide a conducting path through the surface layer that is less than the average length of the conducting paths for signals between the connector or other component mounted to the board and inner layers of the board where the conductive traces are connected to the signal vias. In some embodiments, the shadow vias may be positioned such that the conducting path through the surface layer may be less than 50%, 40%, 30%, 20% or 10% of the average length of the signal paths.

In some embodiments, shadow vias may be positioned so as to provide a conducting path through the surface layer that is less than 5 mm. In some embodiments, the shadow vias may be positioned such that conducting path through the surface layer may be less than 4 mm, 3 mm, 2 mm or 1 mm.

It has been discovered that connector footprints of the type shown in FIGS. 5A, 5B, 7 and 8 and described above provide improved performance as compared with the connector footprints shown in FIG. 3. In particular, the connector footprints of FIGS. 5A, 5B, 7 and 8, exhibit reduced crosstalk between signal vias in offset adjacent columns 500 and 502. The reduced crosstalk extends to very high operating frequencies, such as 18-30 GHz. The disclosed connector footprints also exhibit improved differential mode and common mode performance.

The disclosed technology is not limited in its application to the details of construction and the arrangement of components set forth in the following description or illustrated in the drawings. The disclosed technology is capable of other embodiments and of being practiced or of being carried out in various ways. Also, the phraseology and terminology used herein is for the purpose of description and should not be regarded as limiting. The use of "including," "comprising," "having," "containing," or "involving," and variations thereof herein, is meant to encompass the items listed thereafter and equivalents thereof as well as additional items.

Having thus described at least one illustrative embodiment of the invention, various alterations, modifications and improvements will readily occur to those skilled in the art.

For example, layers may be described as upper layers, or "above" or "below" other layers. It should be appreciated these terms are for ease of illustration and not a limitation on the orientation of layers. In the embodiment illustrated, "upper" refers to a direction towards a surface of a printed circuit board to which components are attached. In some embodiments, components may be attached to two sides of a printed circuit board, such that upper and lower may depend on which vias are being considered. Such alterations, modifications, and improvements are intended to be part of this disclosure, and are intended to be within the spirit and the scope of the present invention.

Further, it was described that each column of signal conductors within a connector may comprise pairs of signal conductors with one or more ground conductors between each pair. In some embodiments, the signal conductors and ground conductors may be arranged such that each pair of signal conductors is between and adjacent to two ground conductors. Such connectors may have a footprint with pairs of signal vias 530, 532 with one or more ground vias in between each pair of signal vias, and, in some embodiments, with each pair of signal vias 530, 532 between and adjacent to two ground vias 550, 552. However, it should be appreciated that, in some embodiments, the ground conductors of the connector, and corresponding ground vias 550, 552 of the printed circuit board, may be omitted from a column. Regardless of the configuration of ground conductors or ground vias, one or more shadow vias may nonetheless be disposed between the signal vias of each pair.

Accordingly, the foregoing description is by way of example only and is not intended to be limiting. The present invention is limited only as defined in the following claims and the equivalents thereto.

What is claimed is:

1. A printed circuit board comprising a connector footprint, the connector footprint comprising:
    a plurality of columns, each of the plurality of columns extending in a column direction and comprising a plurality of pairs of signal vias, with signal vias of each pair offset in the column direction;
    a plurality of first vias having a first diameter, wherein the first vias are disposed within the columns between adjacent pairs of signal vias; and
    a plurality of second vias having a second diameter, wherein the second diameter is smaller than the first diameter, and the second vias are disposed within the columns between adjacent pairs of signal vias.

2. The printed circuit board as defined in claim 1, further comprising at least one conductive shadow via located between signal vias of the pairs of signal vias.

3. The printed circuit board as defined in claim 2, wherein the at least one conductive shadow via comprises two or more shadow vias.

4. The printed circuit board as defined in claim 3, wherein the two or more shadow vias are smaller in diameter than the signal vias.

5. The printed circuit board as defined in claim 3, wherein the connector footprint further comprises an antipad surrounding each of the pairs of signal vias and wherein the two or more shadow vias electrically short opposite sides of the antipad.

\* \* \* \* \*